(12) United States Patent
Kosowsky et al.

(10) Patent No.: US 7,872,251 B2
(45) Date of Patent: Jan. 18, 2011

(54) FORMULATIONS FOR VOLTAGE SWITCHABLE DIELECTRIC MATERIAL HAVING A STEPPED VOLTAGE RESPONSE AND METHODS FOR MAKING THE SAME

(75) Inventors: Lex Kosowsky, San Jose, CA (US); Robert Fleming, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 746 days.

(21) Appl. No.: 11/903,820

(22) Filed: Sep. 24, 2007

(65) Prior Publication Data

US 2010/0270588 A1    Oct. 28, 2010

Related U.S. Application Data

(60) Provisional application No. 60/826,747, filed on Sep. 24, 2006.

(51) Int. Cl.
*H01L 47/00* (2006.01)
(52) U.S. Cl. .............................. 257/3; 257/40; 257/183; 257/E45.001; 438/99; 438/900
(58) Field of Classification Search ..................... 257/3, 257/40, 183, E45.001; 438/99, 900
See application file for complete search history.

(56) References Cited

U.S. PATENT DOCUMENTS

| | | | |
|---|---|---|---|
| 3,347,724 A | 10/1967 | Schneble, Jr. et al. | |
| 3,685,026 A | 8/1972 | Wakabayashi et al. | |
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |

(Continued)

FOREIGN PATENT DOCUMENTS

CH      663491 A5    12/1987

(Continued)

OTHER PUBLICATIONS

U.S. Appl. No. 11/562,222, filed Nov. 21, 2006, Kosowsky, Wireless Communication Device Using Voltage Switchable Dielectric Material.

(Continued)

*Primary Examiner*—Tu-Tu V Ho
(74) *Attorney, Agent, or Firm*—Carr & Ferrell LLP

(57) ABSTRACT

Formulations for voltage switchable dielectric materials include two or more different types of semiconductive materials uniformly dispersed within a dielectric matrix material. The semiconductive materials are selected to have different bandgap energies in order to provide the voltage switchable dielectric material with a stepped voltage response. The semiconductive materials can comprise inorganic particles, organic particles, or an organic material that is soluble in, or miscible with, the dielectric matrix material. Formulations optionally can also include electrically conductive materials. At least one of the conductive or semiconductive materials in a formulation can comprise particles characterized by an aspect ratio of at least 3 or greater.

16 Claims, 4 Drawing Sheets

U.S. PATENT DOCUMENTS

| | | | |
|---|---|---|---|
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger et al. | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |
| 4,726,991 A | 2/1988 | Hyatt et al. | |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,934,584 A | 6/1990 | Boggs | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenco et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hively | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,114,672 A | 9/2000 | Iwasaki | |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shibuta | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,239,687 B1 | 5/2001 | Shrier et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski | |
| 6,433,394 B1 | 8/2002 | Intrater | |
| 6,448,900 B1 | 9/2002 | Chen | |
| 6,455,916 B1 | 9/2002 | Robinson | |
| 6,468,593 B1 | 10/2002 | Iizawa | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,621,172 B2 | 9/2003 | Nakayama | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,709,944 B1 | 3/2004 | Durocher et al. | |
| 6,741,217 B2 | 5/2004 | Toncich et al. | |
| 6,797,145 B2 | 9/2004 | Kosowsky | |
| 6,882,051 B2 | 4/2005 | Majumdar et al. | |
| 6,903,175 B2 | 6/2005 | Gore et al. | |
| 6,911,676 B2 | 6/2005 | Yoo | |
| 6,916,872 B2 | 7/2005 | Yadav et al. | |
| 6,981,319 B2 | 1/2006 | Shrier | |
| 7,034,652 B2 | 4/2006 | Whitney et al. | |
| 7,049,926 B2 | 5/2006 | Shrier et al. | |
| 7,053,468 B2 | 5/2006 | Lee | |
| 7,064,353 B2 | 6/2006 | Bhat | |
| 7,067,840 B2 * | 6/2006 | Klauk et al. ................... 257/40 |
| 7,132,697 B2 | 11/2006 | Weimer et al. | |
| 7,132,922 B2 | 11/2006 | Harris et al. | |
| 7,141,184 B2 | 11/2006 | Chacko et al. | |
| 7,173,288 B2 | 2/2007 | Lee et al. | |
| 7,183,891 B2 | 2/2007 | Harris et al. | |

| | | |
|---|---|---|
| 7,202,770 B2 | 4/2007 | Harris et al. |
| 7,205,613 B2 | 4/2007 | Fjelstand et al. |
| 7,218,492 B2 | 5/2007 | Shrier |
| 7,279,724 B2 | 10/2007 | Collins et al. |
| 7,320,762 B2 | 1/2008 | Greuter et al. |
| 7,417,194 B2 | 8/2008 | Shrier |
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,585,434 B2 | 9/2009 | Morita |
| 7,609,141 B2 | 10/2009 | Harris |
| 2002/0061363 A1 | 5/2002 | Halas et al. |
| 2003/0010960 A1 | 1/2003 | Greuter et al. |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0095658 A1 | 5/2004 | Buretea et al. |
| 2004/0154828 A1 | 8/2004 | Moller et al. |
| 2004/0201941 A1 | 10/2004 | Harris |
| 2004/0211942 A1 | 10/2004 | Clark et al. |
| 2004/0262583 A1 | 12/2004 | Lee |
| 2005/0039949 A1 | 2/2005 | Kosowsky |
| 2005/0057867 A1 | 3/2005 | Harris |
| 2005/0106098 A1 | 5/2005 | Tsang et al. |
| 2005/0218380 A1 | 10/2005 | Gramespacher et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0142455 A1 | 6/2006 | Agarwal |
| 2006/0152334 A1 | 7/2006 | Maercklein et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0234127 A1 | 10/2006 | Kim |
| 2006/0291127 A1 | 12/2006 | Kim et al. |
| 2007/0116976 A1 | 5/2007 | Tan et al. |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2008/0045770 A1 | 2/2008 | Sigmund et al. |
| 2008/0047930 A1 | 2/2008 | Blanchet et al. |
| 2008/0278873 A1 | 11/2008 | Leduc et al. |
| 2009/0309074 A1 | 12/2009 | Chen et al. |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 1003229 A1 | 5/2000 |
| EP | 0790758 | 11/2004 |
| EP | 1542240 A2 | 6/2006 |
| JP | 56091464 A | 7/1981 |
| JP | 63 195275 A | 8/1988 |
| JP | 2000 062076 A1 | 2/2000 |
| WO | WO 8906589 A1 | 7/1989 |
| WO | WO 97/26665 | 7/1997 |
| WO | WO98/23018 | 5/1998 |
| WO | WO 99/24992 | 5/1999 |
| WO | WO 2005100426 A1 | 10/2005 |

OTHER PUBLICATIONS

U.S. Appl. No. 11/562,289, filed Nov. 21, 2006, Kosowsky, Light-Emitting Device Using Voltage Switchable Dielectric Material.
U.S. Appl. No. 11/602,881, filed Nov. 21, 2006, Kosowsky, Semiconductor Devices Including Voltage Switchable Materials for Over-Voltage Protection.
U.S. Appl. No. 11/829,946, filed Jul. 29, 2007, Kosowsky, Voltage Switchable Dielectric Material Having Conductive or Semi-Conductive Organic Material.
U.S. Appl. No. 11/829,948, filed Jul. 29, 2007, Kosowsky, Voltage Switchable Dielectric Material Having High Aspect Ratio Particles.
U.S. Appl. No. 11/829,951, filed Jul. 29, 2007, Kosowsky, Voltage Switchable Dielectric Material Having Conductive or Semi-Conductive Organic Material.
U.S. Appl. No. 11/860,522, filed Sep. 24, 2007, Kosowsky, Technique For Plating Substrate Devices Using Voltage Switchable Dielectric Material and Light Assistance.
U.S. Appl. No. 11/860,530, filed Sep. 24, 2007, Kosowsky, System and Method For Including Protective Voltage Switchabel Dielectric Material in the Design or Simulation of Substrate Devices.
U.S. Appl. No. 11/881,896, filed Jul. 29, 2007, Kosowsky, Device Applications For Voltage Switchable Dielectric Material Having High Aspect Ratio Particles.
U.S. Appl. No. 11/903,820, filed Sep. 24, 2007, Kosowsky, Formulations For Voltage Switchable Dielectric Materials Having a Stepped Voltage Response and Methods For Making the Same.
U.S. Appl. No. 12/193,603, filed Aug. 18, 2008, Kosowsky, Voltage Switchable Dielectric Material Incorporating Modified High Aspect Ratio Particles.
U.S. Appl. No. 12/284,790, filed Sep. 24, 2008, Kosowsky, Methods For Fabricating Current-Carrying Structures Using Voltage Switchable Dielectric Materials.
U.S. Appl. No. 12/356,490, filed Jan. 20, 2009, Fleming, Voltage Switchable Dielectric Material Having Bonded Particle Constituents.
U.S. Appl. No. 12/370,589, filed Feb. 12, 2009, Fleming, Voltage Swtichable Dielectric Material With Superior Physical Properties For Structural Applications.
U.S. Appl. No. 12/407,346, filed Mar. 19, 2009, Fleming, Voltage Switchable Dielectric Materials With Low Band Gap Polymer Binder or Composite.
U.S. Appl. No. 12/417,589, filed Apr. 2, 2009, Kosowsky, Substrate Device or Package Using Embedded Layer of Voltage Switchable Dielectric Material in a Vertical Switching Configuration.
U.S. Appl. No. 12/541,963, filed Aug. 16, 2009, Kosowsky, Core Layer Structure Having Voltage Swtichable Dielectric Material.
U.S. Appl. No. 12/561,195, filed Sep. 16, 2009, Kosowsky, Voltage Switchable Dielectric Material Containing Boron Compound.
U.S. Appl. No. 12/571,318, filed Sep. 30, 2009, Kosowsky, Voltage Switchable Dielectric Material Incorporating Conductive Core-Shell Particles.
Breton et al., "Mechanical properties of multiwall carbon nanotubes/epoxy composites: influence of network morphology," Carbon Elsevier UK, vol. 42, No. 5-6, pp. 1027-1030 (2004).
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Saunders et al., "Nanoparticle-polymer photovoltaic cells," Adv. Colloid Int. Sci., vol. 138, No. 1, pp. 1-23 (2007).
U.S. Appl. No. 10/875,372, filed Apr. 21, 2005, Shrier, Karen P.
U.S. Appl. No. 10/366,174, filed Aug. 19, 2004, Shrier, Karen P.
Facchetti, Antonio, "Semiconductors for Organic Transistors", Materials Today, vol. 10, No. 3, pp. 28-37, Mar. 2007.
Reese, Colin and Bao, Zhenan, "Organic Single-Crystal Field-Effect Transistors", Materials Today, vol. 10, No. 3, pp. 20-27, Mar. 2007.
Modine, F.A. and Hyatt, H.M. "New Varistor Material", Journal of Applied Physics, 64 (8), Oct. 15, 1988, pp. 4229-4232.
Celzard, A., et al.,Journal of Physics: Condensed Matter, 9 (1997) pp. 2225-2237.

U.S. Appl. No. 12/608,297, filed Oct. 29, 2009, Kosowsky, Metal Deposition.
U.S. Appl. No. 12/608,301, filed Oct. 29, 2009, Kosowsky, Metal Deposition.
U.S. Appl. No. 12/608,309, filed Oct. 29, 2009, Kosowsky, Metal Deposition.
U.S. Appl. No. 12/608,315, filed Oct. 29, 2009, Kosowsky, Metal Deposition.
U.S. Appl. No. 12/608,326, filed Oct. 29, 2009, Kosowsky, Metal Deposition.
U.S. Appl. No. 12/694,702, filed Jan. 27, 2010, Kosowsky, Substrates Having Voltage Switchable Dielectric Materials.
U.S. Appl. No. 12/731,557, filed Mar. 25, 2010, Kosowsky, Components Having Voltage Switchable Dielectric Materials.
U.S. Appl. No. 12/607,952, filed Oct. 28, 2009, Fleming.
U.S. Appl. No. 12/642,799, filed Dec. 19, 2009, Fleming.
U.S. Appl. No. 12/638,632, filed Dec. 15, 2009, Fleming.
U.S. Appl. No. 12/692,573, filed Jan. 22, 2010, Fleming.
U.S. Appl. No. 12/717,102, filed Mar. 3, 2010, Kosowsky.
Levinson et al. "The Physics of Metal Oxide Varistors," J. App. Phys. 46 (3): 1332-1341 (1975).
Wikipedia article for "Fullerene chemistry" as originally published on Apr. 8, 2010, http://en.wikipedia.org/wiki/Fullerene_chemistry.

* cited by examiner

FORMULATIONS FOR VOLTAGE SWITCHABLE DIELECTRIC MATERIAL HAVING A STEPPED VOLTAGE RESPONSE AND METHODS FOR MAKING THE SAME

CROSS-REFERENCE TO RELATED APPLICATIONS

This application claims the benefit of U.S. Provisional Application No. 60/826,747 entitled "Voltage Switchable Device and Dielectric Material with Stepped Bandgap Containing Particles" and filed on Sep. 24, 2006, which is incorporated by reference herein. This application is related to U.S. application Ser. No. 11/829,948 entitled "Voltage Switchable Dielectric Material having High Aspect Ratio Particles" and filed on Jul. 29, 2007, and U.S. application Ser. No. 11/829,946 entitled "Voltage Switchable Dielectric Material having Conductive or Semi-Conductive Organic Material" and also filed on Jul. 29, 2007, both of which are incorporated by reference herein.

BACKGROUND OF THE INVENTION

1. Field of the Invention

The present invention relates generally to the field of electronic devices and more particularly to over-voltage protection.

2. Related Art

Semiconductor devices comprising a semiconductor die or chip are easily affected or destroyed by over-voltage events. Examples of over-voltage events include electrostatic discharge (ESD), line transients, and lightening strikes. Electrostatic discharge commonly occurs when a person carrying a static charge touches a semiconductor device. Line transients include power surges on AC power lines, and can also be caused by events such as closing a switch or starting a motor.

Voltage switchable dielectric materials, also known as non-linear resistance materials, are materials that normally behave as dielectric materials, but upon application of a sufficient voltage, known as a switch voltage, will rapidly become electrically conductive. The ability of voltage switchable dielectric materials to switch between non-conductive and conductive states makes these materials well suited for over-voltage protection applications. One requirement for most applications, however, is that the voltage switchable dielectric material cannot appreciably leak current below the normal operating voltage of the device in which the voltage switchable dielectric material is employed.

A common method for manufacturing voltage switchable dielectric materials is to fill a polymer with a high level of metal particles to very near the percolation threshold, typically more than 40% by volume. Unfortunately, voltage switchable dielectric materials manufactured in this way can begin to leak current at normal operating voltages. Also, manufacturing such voltage switchable dielectric materials can be problematic. The metal particles must be uniformly dispersed throughout the polymer and small concentration variations can significantly diminish the properties or produce unacceptable variations in electrical properties. While uniformity can be improved with long mixing times, long mixing times are undesirable for numerous reasons including the cost.

SUMMARY OF THE INVENTION

The present invention provides formulations for voltage switchable dielectric materials that provide stepped responses to different levels of over-voltages. An exemplary voltage switchable dielectric material of the invention comprises a dielectric matrix material and three semiconductive materials disposed within the matrix material. Each of the three semiconductive materials is characterized by a different bandgap energy. Any of the semiconductive materials can comprise, for example, inorganic particles, organic particles, or a solvent soluble organic material. In some embodiments, one of the semiconductive materials has a bandgap energy in the range of about 2 eV to 3 eV. In some of these embodiments, a second semiconductive material has a bandgap energy less than 2 eV, and a third semiconductive material has a bandgap energy greater than 3 eV. In some embodiments, the voltage switchable dielectric material further comprising an electrically conductive material disposed within the matrix material.

Another exemplary voltage switchable dielectric material of the invention comprises a dielectric matrix material and two semiconductive materials characterized by different bandgap energies. One of the semiconductive materials comprises particles characterized by an aspect ratio of at least 3:1.

Still another exemplary voltage switchable dielectric material of the invention comprises a dielectric matrix material and two semiconductive materials characterized by different bandgap energies. In these embodiments, the voltage switchable dielectric material further comprises particles of an electrically conductive material disposed within the matrix material and characterized by an aspect ratio of at least 3:1. In some of these embodiments, one of the semiconductive materials also comprises particles characterized by an aspect ratio of at least 3:1. The voltage switchable dielectric material can have a volume percentage of conductive particles is less than about 35, in some instances.

The present invention also provides methods for fabricating voltage switchable dielectric materials, as well as voltage switchable dielectric materials made by these methods. An exemplary method comprises adding first, second, and third semiconductive materials to a resin, mixing the resin until the first, second, and third semiconductive materials are uniformly dispersed in the resin, and curing the resin. Here, each of the first, second, and third semiconductive materials is characterized by a different bandgap energy. At least one of the first, second, or third semiconductive materials can comprise a solvent soluble organic material. In some embodiments, mixing is performed with a rotor-stator mixer and/or includes sonication. The method can further comprise adding a solvent to the resin during mixing. Curing the resin, in some instances, includes exposing the resin to a plurality of curing periods, where each successive curing period is at a higher temperature than the previous curing period.

DETAILED DESCRIPTION OF THE INVENTION

The present invention provides formulations for voltage switchable dielectric materials. The formulations are characterized by two or more different types of semiconductive materials distributed within a dielectric matrix material. The semiconductive materials are selected to have different bandgap energies in order to provide the resulting voltage switchable dielectric material with a stepped response to different levels of over-voltages. The semiconductive materials can take the form of particles, but are not limited thereto. Alternatively, a semiconductive material can be soluble in, or miscible with, the dielectric matrix material. Formulations optionally can also include electrically conductive and/or insulating materials. In some embodiments, at least one of the conductive or semiconductive materials comprises particles characterized by an aspect ratio of at least 3 or greater. Such high aspect ratio particles allow for an overall reduction of the volume percentage of conductive particles relative to prior art formulations. Benefits that can be derived from these formulations include a lower leakage current at normal operating voltages, as well as generally improved properties for electronics applications such as capacitance, dielectric constant, crack resistance, and coefficient of thermal expansion.

Figure 1:
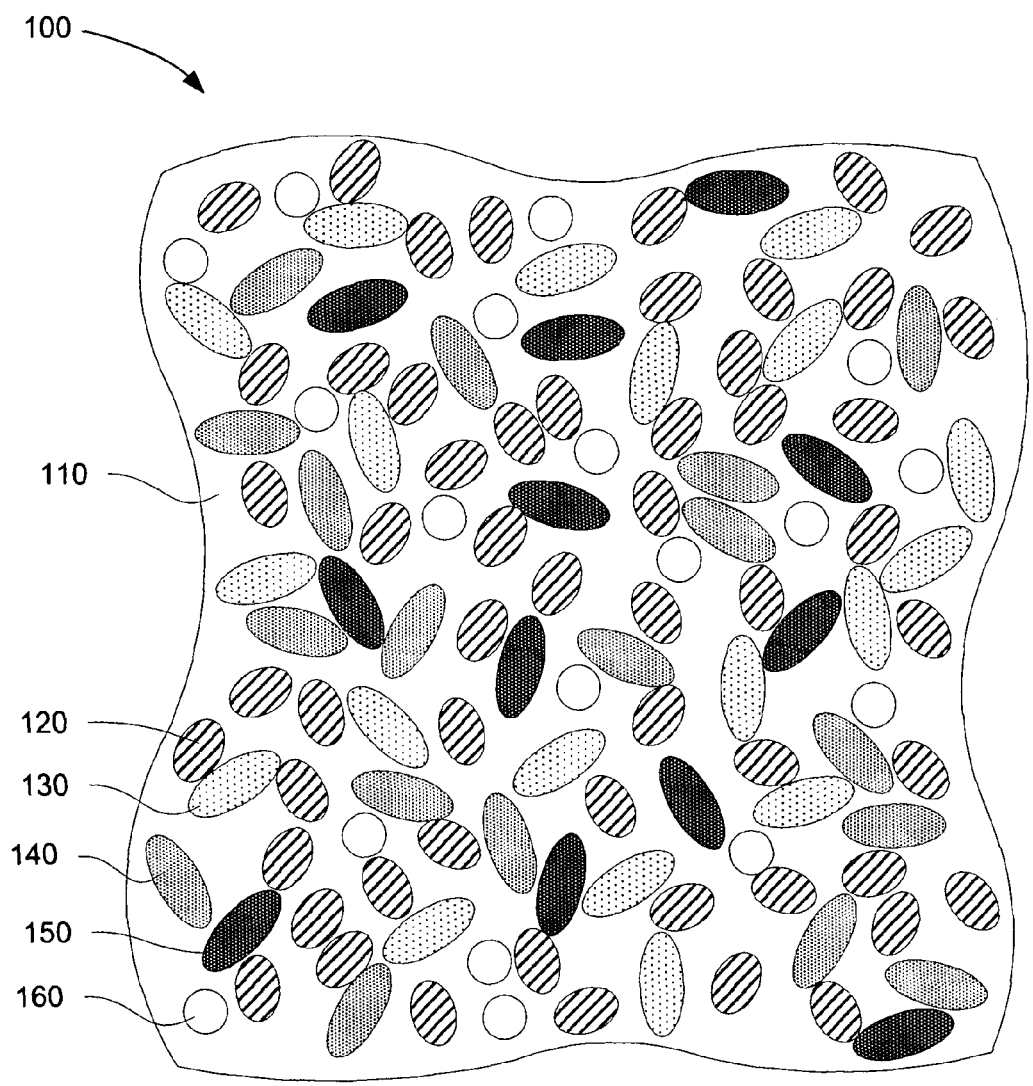
FIG. 1 shows a cross-sectional view of voltage switchable dielectric material according to an exemplary embodiment of the invention.

FIG. 1 schematically illustrates a formulation for a voltage switchable dielectric material 100 according to an exemplary embodiment of the invention. In FIG. 1, a matrix material 110 is filled with particles 120 of a conductive material, particles 130, 140, 150 of three semiconductive materials having different bandgap energies, and particles 160 of an insulating material. It will be understood that even though FIG. 1 shows a formulation including five different types of particles 120, 130, 140, 150, 160, formulations of the invention may omit the conductive particles 120 and/or the insulating particles 150. Other embodiments only include particles 130, 140 of two semiconductive materials having different bandgap energies, rather than all three particles 130, 140, and 150. It will be appreciated that the shapes, sizes, and numbers of the particles 120, 130, 140, 150, 160 are merely illustrative and not meant to be representative of any particular formulation.

Further, while FIG. 1 illustrates particles 130, 140, 150 of semiconductive materials, it will be understood that one or more of the particles 130, 140, 150 can be replaced with an organic semiconductive material that is at least partially soluble in, or miscible with, the matrix material 110. Such semiconductive materials may not present as discrete particles within the matrix material 110, in some embodiments, but are shown as particles for the purposes of illustration only.

The particles 120, 130, 140, 150, 160 are uniformly dispersed throughout the matrix material 110 in the embodiment illustrated by FIG. 1 such that some particles 120, 130, 140, 150 are completely insulated by the matrix material 110, while other particles 120, 130, 140, 150 are in contact with one another. Thus, a typical conductive path of least resistance through the voltage switchable dielectric material 100 will pass through some of each of the particles 120, 130, 140, 150.

Some suitable dielectric materials for the matrix material 110 are organic polymers. Examples of such suitable organic polymers include silicone polymer, phenolic resin, epoxy, polyurethane, poly(meth)acrylate, polyamide, polyester, polycarbonate, polyacrylamides, polyimide, polyethylene, polypropylene, polyphenylene oxide, polysulphone, ceramer (a solgel/polymer composite), and polyphenylene sulfone. One particular epoxy that works well is EPON Resin 828, an undiluted clear difunctional bisphenol A/epichlorohydrin derived liquid epoxy resin that can be hardened with an appropriate curing agent. Some dielectric inorganic polymers are also suitable for the matrix material 110 such as siloxane, and polyphosphazines.

In some embodiments, the particles 120 of the conductive material comprise a metal. Suitable metals include copper, aluminum, nickel, silver, gold, titanium, stainless steel, chromium, and alloys thereof. Other suitable materials for the conductive particles 120 include TiC, TiN, and $TiB_2$. A suitable particle size for the particles 120 of the conductive material is on the order of 2 microns ($\mu$). While the particles 120 of the conductive material shown in FIG. 1 are shown as slightly elongated, (i.e, having an aspect ratio greater than 1), it will be understood that the particles 120 of the conductive material are not limited to a slightly elongated shape. In various embodiments, the particles 120 of the conductive material can comprise a shape ranging from spherical to highly elongated, or can even include a distribution of shapes.

The particles 130, 140, 150 of the semiconductive materials are particles of materials having bandgap energies within the range of approximately 1 eV to 6 eV, though this range should not be viewed as strictly limiting. The bandgap energy is the energy required to excite an electron out of the valence band and into the conduction band. Examples of suitable semiconducting materials include Si, NiO, SiC, ZnO, BN, C (either in the form of diamond, nanotubes, or fullerenes), ZnS, $Bi_2O_3$, $Fe_2O_3$, $CeO_2$, $TiO_2$, AlN, and compounds of indium diselenide. In particular, $TiO_2$ can be undoped or doped, for example with $WO_3$, where doping in this instance refers to a surface coating. While the particles 130, 140, 150 of the semiconductive materials shown in FIG. 1 as slightly elongated, (i.e, have an aspect ratio greater than 1), it will again be understood that the particles 130, 140, 150 of the semiconductive materials also are not limited to a slightly elongated shape. In various embodiments, any of the particles 130, 140, 150 of the semiconductive materials can be a shape ranging from spherical to highly elongated, or can even include a distribution of shapes.

In some embodiments, the particles 120 of the conductive material comprise high aspect ratio particles such as electrically conductive carbon nanotubes, both single walled and multi-walled, fullerenes, metal nanorods, or metal nanowires. Examples of materials that form nanorods and/or nanowires include boron nitride, antimony tin oxide, titanium dioxide, silver, copper, tin, and gold.

In other embodiments, one or more of the particles 130, 140, 150 of the semiconductive materials comprise high aspect ratio particles. Examples include semiconductive carbon nanotubes, semiconductive nanorods, and semiconductive nanowires. In still other embodiments, both the conductive particles 120 and at least one of the particles 130, 140, 150 of the semiconductive materials comprise high aspect ratio particles. Any of the particles 120, 130, 140, 150 can have an aspect ratio of at least 3:1. In some embodiments, one or more of the particles 120, 130, 140, 150 have an aspect ratio of at least 10:1, 100:1, or 1000:1.

Nanoscale particles, characterized by a smallest dimension no greater than 500 nm, can also be employed for any of the particles 120, 130, 140, 150. In various embodiments, at least some of the particles 120, 130, 140, 150 have a smallest dimension less than 100 nm or 50 nm. In some instances, at least some of the particles 120, 130, 140, 150 are characterized by a diameter of about 20 nm.

In still further embodiments, any of the particles 130, 140, 150 of the semiconductive materials can comprise an organic material. Incorporating organic materials within the matrix material 110 can result in a voltage switchable dielectric material 100 with superior properties compared with a voltage switchable dielectric material 100 that only includes inorganic materials. Such properties include the coefficients of thermal expansion and thermal conductivity, the dielectric constant; the fracture toughness, compression strength, and the ability to adhere to metals.

Examples of organic semiconductors include forms of carbon such as electrically semiconducting carbon nanotubes and fullerenes (e.g., $C_{60}$ and $C_{70}$). Fullerenes and nanotubes can be modified, in some embodiments, to be functionalized to include a covalently bonded chemical group or moiety. Other examples of organic semiconductors include poly-3-hexylthiophene, polythiophene, polyacteylene, poly (3,4-ethylenedioxythiophene), poly(styrenesulfonate), pentacene, (8-hydroxyquinolinolato) aluminum (III), and N,N'-di-[(naphthalenyl)-N,N'diphenyl]-1,1'-biphenyl-4,4'-diamine [NPD]. Additionally, organic semiconductors can be derived from the monomers, oligomers, and polymers of thiophene, analine, phenylene, vinylene, fluorene, naphthalene, pyrrole, acetylene, carbazole, pyrrolidone, cyano materials, anthracene, pentacene, rubrene, perylene, and oxadizole. Some of these organic materials are considered to be photoactive organic materials, such as polythiophene.

In general terms, the present invention provides for a wide range of formulations that include the above described conductive, semiconductive and insulating materials. For example, the volume percentage of the matrix material 110 can vary from about 5 to about 99% and can include 0 to about 70% by volume of a conductive material, and about 0.01 to about 95% by volume of semiconductive materials. Within these broad ranges, any or all of the conductive and semiconductive materials can comprise particles with aspect ratio of at least 3. Also within these broad ranges, any or all of the semiconductive materials can comprise organic materials.

In some embodiments, the matrix material 110 comprises about 20% to about 80% by volume, conductive material comprise about 10% to about 50% by volume, and the semiconductive materials comprise 0% to about 70% by volume. These embodiments can include a volume percentage of conductive and/or semiconductive particles with aspect ratios of at least 3 in the range of about 0.01% to about 40%. These embodiments can further include a volume percentage of semiconductive organic materials in the range of about 0.01% to about 40%.

Figure 2:
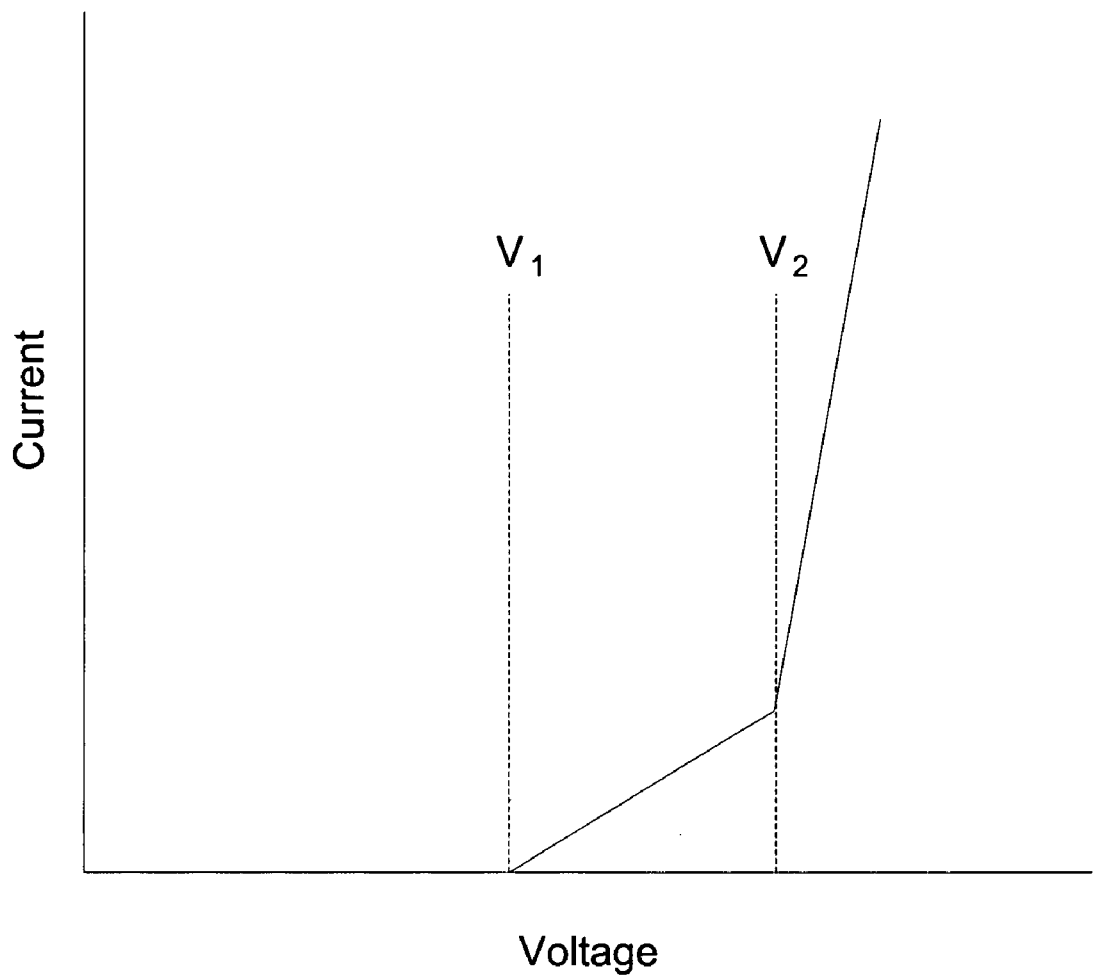
FIG. 2 is a plot of current as a function of voltage applied to an exemplary embodiment of a voltage switchable dielectric material.

As noted above, the particles 130, 140, 150 of the semiconductive materials are characterized by different bandgap energies to provide the voltage switchable dielectric material 100 with a stepped response to over-voltages. FIG. 2 illustrates the stepped response for a formulation with two particles 130, 140 of the semiconductive materials. In FIG. 2, the voltage applied to the voltage switchable dielectric material 100 is plotted against the current that the voltage switchable dielectric material 100 will conduct. It will be understood that the electrical conductance of the voltage switchable dielectric material 100 could have been plotted in place of the current in FIG. 2 and would have resulted in the same illustration.

In the illustrated example, an over-voltage event having a peak voltage above a first threshold ($V_1$) will be sufficient to cause the particles 130 of the semiconductive material with the lowest bandgap to conduct but will not be sufficient to cause the particles 140 of the semiconductive material with the higher bandgap to conduct, unless the peak voltage also exceeds a second threshold ($V_2$). The concept can be readily extended to formulations with three or more types of particles 130, 140, 150 of the semiconductive materials, each characterized by a different bandgap energy. The difference in the bandgap energies of the various semiconductive materials will determine the voltage difference from one threshold to the next. In some embodiments that include three semiconductive materials, the material with the lowest bandgap energy has a bandgap energy less than 2 eV, the material with the highest bandgap energy has a bandgap energy greater than 3 eV, and the remaining material has a bandgap energy in the range of about 2 eV to 3 eV.

Figure 3:
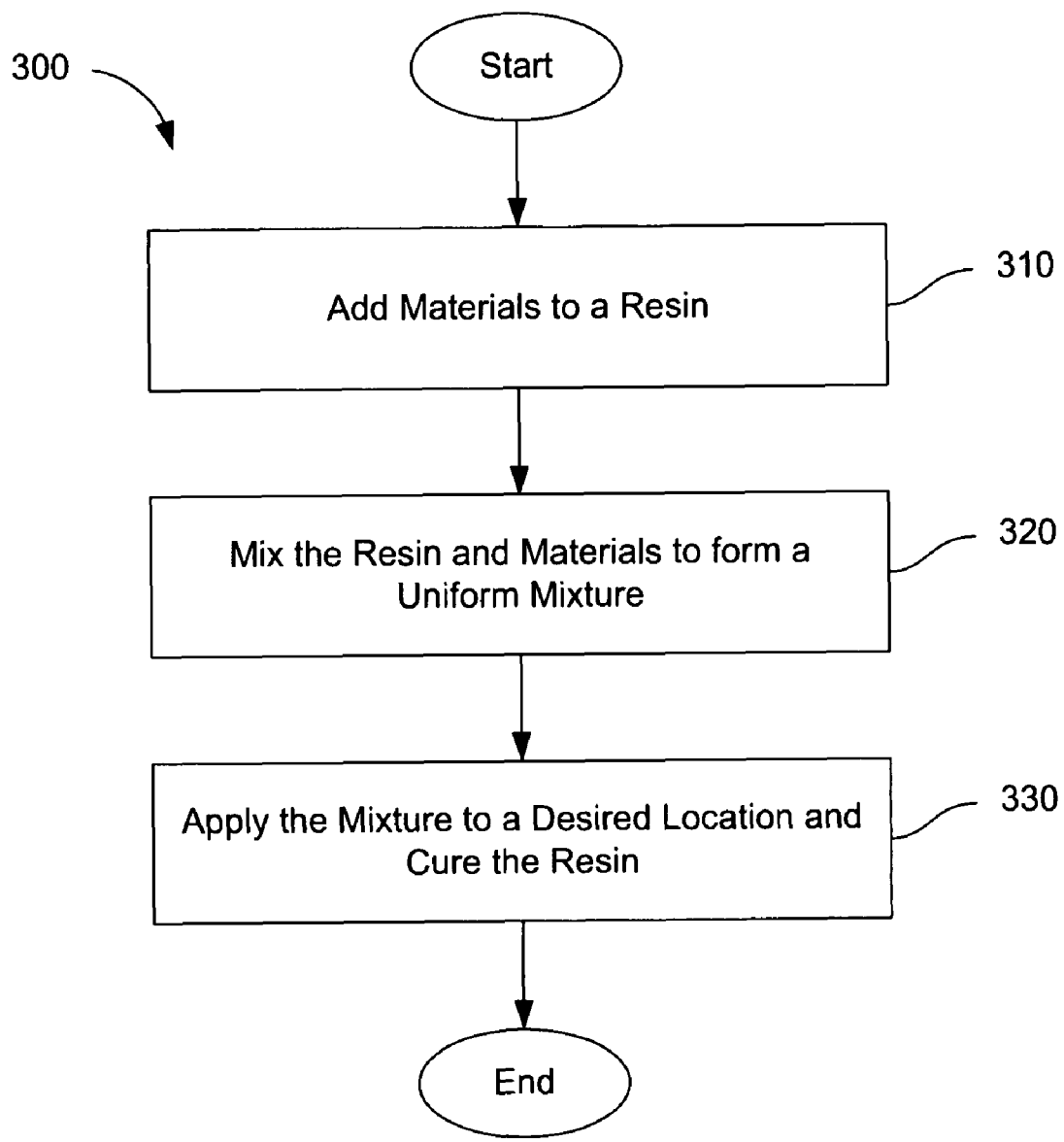
FIG. 3 is a flow-chart representation of a method for making a voltage switchable dielectric material according to an exemplary embodiment of the invention.

The present invention also provides methods for making voltage switchable dielectric materials. FIG. 3 is a flowchart representation of an exemplary method 300 for making a voltage switchable dielectric material. In a Step 310 various materials are added to a resin such as EPON Resin 828 with a silane coupling agent. The various materials can include the conductive, semiconductive, and insulating materials described above. The semiconductive materials can comprise either inorganic particles, organic particles, or organic materials dissolved in a solvent. For instance, poly-3-hexylthiophene can be dissolved in toluene. The conductive and the semiconductive materials can optionally comprise high aspect ratio particles.

In Step 310, the various materials can be added sequentially, all together, or in various combinations. In some embodiments, high aspect ratio particles are added first, followed by the remaining materials. Step 310 can also include adding a solvent to the resin, such as NMP (N-methyl-2 pyrrolidone). Step 310 can also comprise adding curing and/or catalyst agents to the resin. A suitable curing agent is a 15% by weight solution of Dyhard T03 dissolved in NMP.

The quantity of conductive and/or semiconductive particles added to the resin in Step 310 will depend, at least in part, on their aspect ratios. The greater the aspect ratio, the lower the necessary quantity. For example, carbon nanotubes having aspect ratios in excess of 1000 may be added in a quantity that will result in a weight percentage of carbon nanotubes in the final composition of between about 0.01% and about 10%. In some instances, the quantity of carbon nanotubes that is added to the resin is such that the weight percentage of carbon nanotubes in the final composition is about 1%. Particles with lower aspect ratios can be added in a quantity that will result in a weight percentage in the final composition of greater than 10%. For example, particles with an aspect ratio of about 10 can be added in a quantity sufficient to provide the final formulation with about 25 weight percent or more of such particles.

Next, in a Step 320, the resin is mixed for a period on the order of minutes to hours (e.g., 8 hours) to produce a uniform mixture within which the particles having an aspect ratio of at least 3 are uniformly dispersed within the resin. Mixing can include, for example, sonication and rotor-stator mixing. Additional solvent can also be added during the mixing.

Following mixing, the mixture is applied to a desired location and the resin is cured in a Step 330. The mixture can be applied, for example, by screen printing or by wire wound rod coating. A suitable wire for the wire wound rod coating process is a #50 wire. An exemplary curing process exposes the mixture to a plurality of curing periods, wherein each successive curing period is at a higher temperature than the previous curing period. One such suitable curing process employs, in succession, a 10 minute curing period at 75° C., a 10 minute curing period at 125° C., a 45 minute curing period at 175° C., and a 30 minute curing period at 187° C.

In the Step 330, the desired location can be, for example, on or within a printed circuit board, a semiconductor package, a semiconductor device, a radio frequency identification (RFID) tag, a light emitting diode (LED), a display backplane, a discreet surge suppressing device, or an intermediate component produced during the fabrication of any of these.

Figure 4:
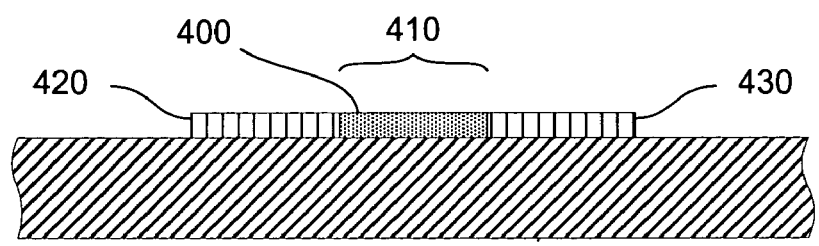
FIG. 4 is cross-section of an exemplary voltage switchable dielectric material applied to a gap between two electrodes according to an exemplary embodiment of the invention.

FIG. 4 illustrates an exemplary application in which a voltage switchable dielectric material 400 is disposed in a gap 410 between an electrode 420 in electrical communication to ground and an electrode 430 that is biased relative to ground. Such an arrangement can be used to protect just about any circuit or device against over-voltage events. The voltage switchable dielectric material 400 can be formed in the gap 410 by applying and curing a uniform mixture, as described above with respect to FIGS. 2 and 3, within the gap 410.

Figure 5:
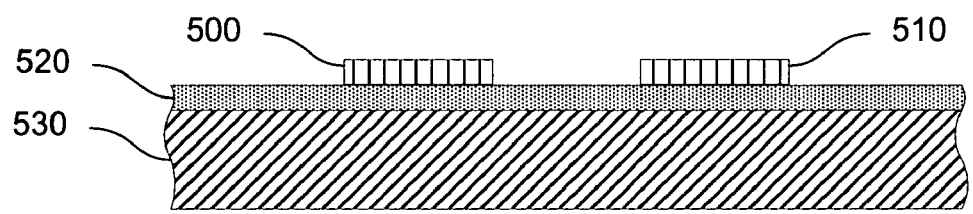
FIG. 5 is cross-section of two electrodes disposed on a layer of a voltage switchable dielectric material according to an exemplary embodiment of the invention.

Another arrangement is shown in FIG. 5 where electrodes 500, 510 are disposed on a layer 520 of voltage switchable dielectric material on a substrate 530. Here, the layer 520 of the voltage switchable dielectric material can be formed on the substrate 530 by applying and curing a uniform mixture, as described above with respect to FIG. 3, on the substrate 530. The electrodes 500, 510 can then be fabricated on the layer 520 by conventional means. For example, a seed layer can be deposited on the layer 520, a mask patterned over the seed layer, and the electrodes 500, 510 formed by electroplating. Alternately, the seed layer can be omitted from the prior method. After the mask has been patterned, the layer 520 of the voltage switchable dielectric material can be made conductive by applying a suitable voltage thereto. Once conductive, the electrodes 500, 510 can then be plated directly onto the layer 520. Methods for electroplating directly onto voltage switchable dielectric materials are described in more detail in U.S. Pat. No. 6,797,145 entitled "Current Carrying Structure using Voltage Switchable Dielectric Material."

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A voltage switchable dielectric material comprising:
   a dielectric matrix material;
   a first semiconductive material characterized by a first bandgap energy and disposed within the matrix material;
   a second semiconductive material disposed within the dielectric matrix material and characterized by a second bandgap energy different than the first bandgap energy; and
   a third semiconductive material disposed within the dielectric matrix material and characterized by a third bandgap energy different than the first and second bandgap energies.

2. The voltage switchable dielectric material of claim 1 wherein the first semiconductive material disposed within the dielectric matrix material comprises particles.

3. The voltage switchable dielectric material of claim 1 further comprising an electrically conductive material disposed within the matrix material.

4. The voltage switchable dielectric material of claim 1 wherein the dielectric matrix material is selected from a group consisting of silicone polymer, phenolic resin, epoxy, polyurethane, poly(meth) acrylate, polyamide, polyester, polycarbonate, polyacrylamides, polyimide, polyethylene, polypropylene, polyphenylene oxide, polysulphone, ceramer, polyphenylene sulfone, siloxane, and polyphosphazine.

5. The voltage switchable dielectric material of claim 1 wherein the second bandgap energy is in the range of about 2 eV to 3 eV.

6. The voltage switchable dielectric material of claim 5 wherein the first bandgap energy is less than 2 eV and the third bandgap energy is greater than 3 eV.

7. A voltage switchable dielectric material comprising:
   a dielectric matrix material;
   particles of a first semiconductive material characterized by a first bandgap energy and disposed within the matrix material, the particles of the first semiconductive material further characterized by an aspect ratio of at least 3:1; and
   a second semiconductive material disposed within the dielectric matrix material and characterized by a second bandgap energy different than the first bandgap energy.

8. The voltage switchable dielectric material of claim 7 further comprising an electrically conductive material disposed within the matrix material.

9. The voltage switchable dielectric material of claim 7 wherein the particles of the first semiconductive material include particles of a material selected from the group consisting of single walled nanotubes, multiwalled nanotubes, fullerenes, semiconductive nanorods, and semiconductive nanowires.

10. The voltage switchable dielectric material of claim 7 wherein the second semiconductive material include particles of a material selected from the group consisting of silicon, silicon carbide, boron nitride, aluminum nitride, nickel oxide, zinc sulfide, bismuth oxide, iron oxide, tungsten oxide, and titanium dioxide.

11. The voltage switchable dielectric material of claim 7 wherein the aspect ratio of the particles of the first semiconductive material is at least 1000:1.

12. A voltage switchable dielectric material comprising:
   a dielectric matrix material;
   particles of an electrically conductive material disposed within the matrix material and characterized by an aspect ratio of at least 3:1;
   a first semiconductive material characterized by a first bandgap energy and disposed within the matrix material; and
   a second semiconductive material disposed within the dielectric matrix material and characterized by a second bandgap energy different than the first bandgap energy.

13. The voltage switchable dielectric material of claim 12 wherein the particles of the electrically conductive material are selected from the group consisting of electrically conductive nanorods, nanowires, single walled nanotubes, multi-walled nanotubes, and fullerenes.

14. The voltage switchable dielectric material of claim 12 wherein the first semiconductive material includes particles of a material selected from the group consisting of silicon, silicon carbide, boron nitride, aluminum nitride, nickel oxide, zinc sulfide, bismuth oxide, iron oxide, and titanium dioxide.

15. The voltage switchable dielectric material of claim 12 wherein the first semiconductive material comprises particles also characterized by an aspect ratio of at least 3:1.

16. The voltage switchable dielectric material of claim 12 wherein a volume percentage of conductive particles is less than about 35.

* * * * *